United States Patent [19]

Summers et al.

[11] 4,431,969
[45] Feb. 14, 1984

[54] CLOCK PULSE PHASE SHIFTER

[75] Inventors: Christopher P. Summers, London; John R. Kinghorn, Sutton, both of England

[73] Assignee: U.S. Philips Corporation, New York, N.Y.

[21] Appl. No.: 324,885

[22] Filed: Nov. 25, 1981

[30] Foreign Application Priority Data

Dec. 12, 1980 [GB] United Kingdom ................ 8039875

[51] Int. Cl.³ .............................................. H03L 7/00
[52] U.S. Cl. .................................... 328/155; 307/512; 307/262
[58] Field of Search ................... 328/55, 155; 307/511, 307/512, 262

[56] References Cited

U.S. PATENT DOCUMENTS

| | | | |
|---|---|---|---|
| 3,475,626 | 10/1969 | Holzman et al. | 328/155 |
| 4,297,641 | 10/1981 | Sterzer | 328/155 |
| 4,360,747 | 11/1982 | Ryan | 307/511 |
| 4,379,264 | 4/1983 | Lenhardt | 307/512 |

*Primary Examiner*—John S. Heyman
*Attorney, Agent, or Firm*—Thomas A. Briody; William J. Streeter; Edward W. Goodman

[57] ABSTRACT

As shown in FIG. 8, a phase shifter for phase shifting a single frequency clock signal CK as produced by an oscillator (813) comprises an inverter (805) and a delay network (804) for producing phase quadrature versions $I_{ac}$, $\bar{I}_{ac}$ and $Q_{ac}$, $\bar{Q}_{ac}$ of the signal. A current generator (803) produces control currents $I_c$, $\bar{I}_c$ and $Q_c$, $\bar{Q}_c$, the magnitudes of which are determined by a control voltage $V_c$ whose magnitude represents a required phase shift. Two multipliers (801) and (802) multiply the signal pairs $I_{ac}$, $\bar{I}_{ac}$ and $I_c$, $\bar{I}_c$; and the signal pairs $Q_{ac}$, $\bar{Q}_{ac}$ and $Q_c$, $\bar{Q}_c$, to produce resultant quadrature signals which are combined in an adder (806) to produce the phase shifted clock signal CLK (and $\overline{CLK}$). The phase shift range is made to cover a number of cycles by an arrangement comprising two limit detectors (807) and (808), an OR-gate (809), a ÷2 circuit (810), and two reversing switches (811) and (812). This arrangement serves to reverse the sense of the control voltage $V_c$ at each limit of its operating range so that this range can be used successively a number of times to represent progressive phase shift. The current generator (803) can also be modified to provide control currents representing a phase shift of more than one cycle.

9 Claims, 14 Drawing Figures

CLOCK PULSE PHASE SHIFTER

BACKGROUND OF THE INVENTION

This invention relates to a data pulse receiver arrangement of a type suitable for the acquisition of data pulsed which occur in a serial bit stream in a received information signal in which one level of the signal (e.g. high) represents a binary value '1' and another of the signal (e.g. low) represents a binary value '0', said arrangement including a data clock pulse generator for clocking the data pulses into the data pulse receiver arrangement. The invention relates more particularly to a phase shifter in or for use in such data clock pulse generator.

A data pulse receiver arrangement of the above type (which is known for instance from Mullard Technical Information No. 34, dated September 1976, and Mullard Technical Information No. 54, dated August 1977) has application in data transmission systems in which data transmission and reception is not synchronized. Such a data transmission system, is for example, the BBC/IBA Teletext television transmission system in which coded data pulses representing alphanumeric text or other message information are transmitted in a video signal in at least one television line in field-blanking intervals where no picture signals representing normal picture information are present. United Kingdom Patent Specification No. 1,370,535 discloses a television transmission system of this form.

A difficulty that occurs with such an application of the data pulse receiver arrangement is to synchronizing clock pulses locally generated therein with the received data pulses. One technique for achieving this synchronization is to generate a local data pulse clock independently of the received data pulses and then shift its phase into synchronism with them. A data clock pulse generator which is suitable for this purpose may comprise an oscillator arranged for oscillation at a predetermined frequency to produce locally generated clock pulses, together with a phase sensitive detector which is operable to produce a control signal in accordance with the relative phases of the received data pulses and the clock pulses, which control signal is then used to correct the phase of the oscillator output signal to bring the data pulses and clock pulses into synchronism.

The control exercised by the control signal may act directly on the oscillator (e.g. in the case of a voltage-controlled oscillator), so that the phase of the oscillator output signal, as actually produced, is corrected. Alternatively, the control exercised by the control signal may cause a phase shifter to alter the phase of the oscillator output signal after it has been produced. This latter form of control permits a highly stable oscillator, such as a crystal-controlled oscillator, to be used to generate the clock pulses, but it requires the use of a phase shifter which can produce a large accurate phase shift.

In U.S. Pat. No. 3,475,626, there is described a phase shifter which can phase shift a single frequency signal accurately by a desired amount in the range 0° to 360°

This phase shifter is of a character comprising phase quadrature means for producing, in phase quadrature, first and second signal versions of the single frequency signal, function generator means responsive to a control signal representative of a required phase shift to produce first and second control factors, multiplier means operable to multiply said first and second signal versions by said first and second control factors, respectively, to produce resultant first and second signal versions in phase quadrature having respective controlled amplitudes, and combining means for combining said first and second resultant signal versions to produce an output signal which is a phase shifted version of said (original) single frequency signal, the controlled amplitudes of said resultant signal versions determining the phase of the output signal.

This phase shifter may be so arranged that with said resultant first and second signal versions in phase quadrature expressed as $x \cos wt$ and $y \sin wt$, where $x$ and $y$ are their respective controlled amplitudes, the relationship $\sqrt{x^2+y^2}=A$, where A is the output signal amplitude, is achieved to provide a substantially constant amplitude for A. The output signal ($x \cos wt + y \sin wt$) can be expressed as $A \sin(wt+\theta)$, where $\theta$ is the required phase shift.

The requirement for the phase shift ($\theta$) to lie anywhere between 0° and 360° can be achieved by so arranging the function generator means so that the controlled amplitudes ($x$ and $y$) are made positive or negative, selectively, so that $\theta$ lies in one of the four quadrants 0° to 90°, to 180°, 181° to 270° and 271° to 360°.

SUMMARY OF THE INVENTION

According to the present invention, a phase shifer of the above character is further characterized in that means are provided therein which are responsive to said control signal to so control the production of said first and second control factors as they affect the production of said first and second resultant signal versions of the single frequency signal that the phase shift ($\theta$) can extend over a number of complete cycles of the single freuquency signal.

In carrying the invention into effect, said means can be a modified function generator means which, for different values of said control signal within a given range of values, is operable to produce the first and second control factors with such polarities as to cause the controlled amplitudes of said first and second resultant signal versions in phase quadrature to be positive or negative, selectively, for more than one value of said control signal within said range, so that the phase shift ($\theta$) can lie in any one of the four quadrants of more than one cycle of the single frequency signal.

Alternatively, in carrying the invention into effect, said means can comprise first means which, each time the control signal reaches a limit value at either end of a range of values corresponding to a given phase range, is operable to reverse the operating sense of the phase shifter in its utilization of said first and second control factors, together with second means for causing an associated phase sensitive detector, which produces the control signal, to reverse the sense that the control signal changes value in response to detected phase variation. Said given phase range can be less than, equal to, or greater than the range 0° to 360°.

A combination of both the above means of achieving a number of complete cycles of phase shift of the single frequency signal is also possible.

A phase shifter in accordance with the present invention can, in principle, achieve a phase shift of so many successive cycles that an effective small change (i.e. increase or decrease) in the frequency of the single frequency signal can be produced. This facility of effecting a small frequency change is particularly advantageous in a contemplated application of the present invention in the generation of a local data pulse clock for clocking data pulses into a data pulse receiver arrangement from different data sources such as, for instance, an over-air Teletext broadcast transmission on the one hand, and a video cassette recorder (VCR) or other form of local data store in which previously transmitted Teletext data has been recorded, on the other hand. This advantage is due to the fact that although the different data sources nominally would transmit data at the same bit rate, their actual bit rates can, in practice, vary slightly by a few Hz. with respect to the correct rate due to transmission tolerances. The small changes in clock pulse frequency which are made possible with the phase shifer according to the invention, adjust the clock pulse frequency to the actual data bit rate of a received data bit stream.

The embodiment of the phase shifter using a modified function generator affords the advantage that, as will be described, such generator is particularly suited to being realized in integrated circuit form. The embodiment of the phase shifter using said first and second means affords the advantage that it can be realized by simple adaptation of the basic form of phase shifter as described in the aforementioned U.S. patent specification.

The phase shifter may be so arranged that the first and second signal versions as produced by the phase quadrature means comprising respective pairs of anti-phase signals, that the first and second control factors are control currents which are produced by a current generator, which constitutes the function generator means, as respective pairs of oppositely poled currents of which the difference between the two currents of each pair represents the relevant control current, and that said multiplier means comprises a first four quadrant multiplier for producing said first resultant signal version in response to one of said pipes of anti-phase signals and one of said pairs of oppositely poled currents and a second four quadrant multiplier for producing said second resultant signal version in response to the other of said pairs of anti-phase signals and the other of said pairs of oppositely poled currents.

Said current generator can comprise a plurality of transistor pairs each having first and second transistors connected in a long-tailed configuration in which their emitters are coupled to a current source via respective emitter resistances, which transistor pairs are arranged in two sets that provide said respective pairs of oppositely poled currents at respective pairs of positive and negative output terminals; in which two sets the base of the first transistor of each pair is connected to receive a control voltage which constitutes said control signal and the base of the second transistor of each pair is connected to a respective tapping point of a potential divider, which tapping points, as considered in their order of potential, have bases of the second transistors from one set and the other connected to them alternately; and in each set the collectors of the first transistors of successive transistor pairs are connected to the positive output terminal and the negative output terminal alternately, and likewise their second transistor collectors are connected to these terminals alternately, the arrangement being such that for a given value of control voltage lying between the potentials of two immediately adjacent tapping points, those transistor pairs having their second transistor bases connected to respective other tapping points have one transistor fully conductive and the other non-conductive, whereas for the two transistor pairs, one from each set, having their second transistor bases connected respectively these two immediately adjacent tapping points, their two transistors are both partially conductive differentially to an extent determined by the value of said emitter resistances and said control voltage.

Each of said sets comprises two transistor pairs for each phase shift in the range 0° to 360°, so that for a phase shift range covering a number of complete cycles in accordance with the present invention, each set would have an appropriate number of transistor pairs. In general, each transistor pair can provide a phase shift of 90° maximum.

DESCRIPTION OF THE DRAWINGS

In order that the invention may be more fully understood reference will not be made by way of example to the accompanying drawings, in which.

DESCRIPTION OF THE PREFERRED EMBODIMENT

Figure 1:
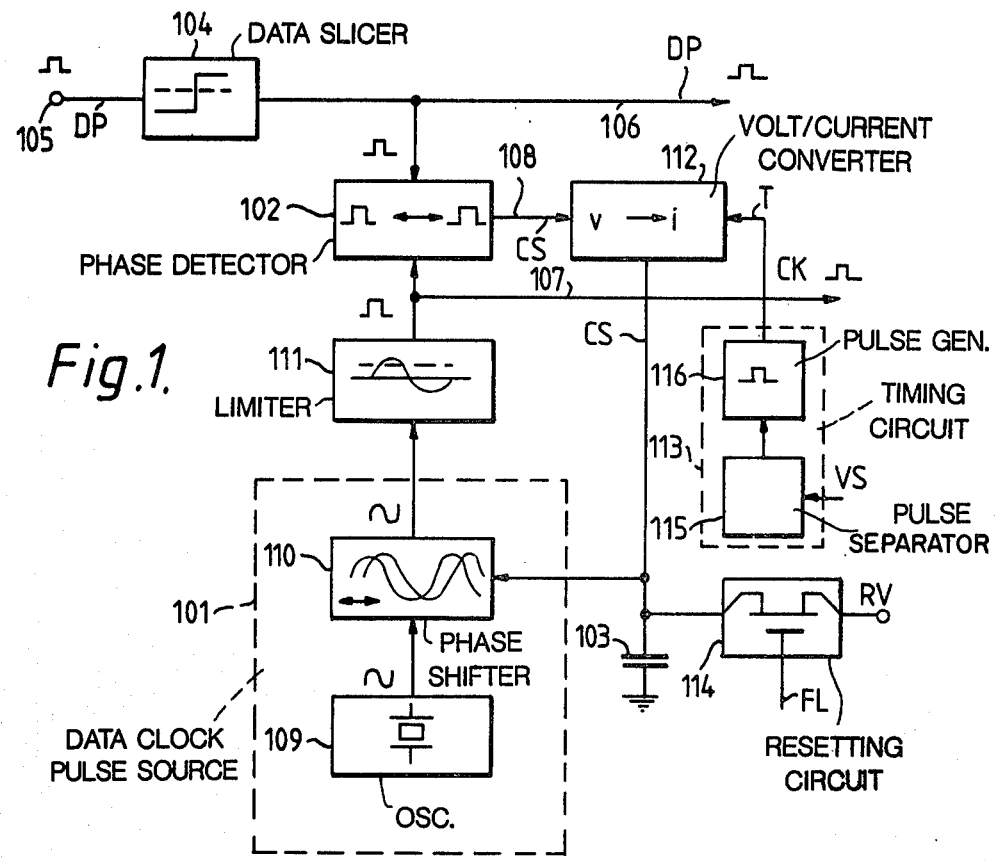
FIG. 1 shows a block diagram of a data clock pulse generator.

Referring to the drawings, the data clock pulse generator shown in FIG. 1 has a specific application in a data pulse receiver arrangement for the aforesaid BBC/IBA Teletext television transmission system. This data clock pulse generator includes a data clock pulse source 101, a phase sensitive detector 102 and a storage capacitor 103. A data slicer 104 receives data pulses DP from an input terminal 105. After level correction and possibly re-shaping (by suitable known means not shown), the data pulses DP are applied to an output lead 106 for utilization in further circuitry, the pulses DP being clocked into this further circuitry by means of clock pulses CK which are applied to a clock pulse lead 107 by the source 101. The data pulses DP and clock pulses CK are also applied to the phase sensitive detector 102 which is responsive thereto to produce a control signal CS on a control lead 108, this control signal CS having a value in accordance with the relative phase of the data pulses DP and the clock pulses CK.

The source 101 comprises a crystal-controlled oscillator 109 and a phase shifter 110. The oscillator 109 produces a highly stable alternating signal at the clock frequency and the phase shifter 110 is responsive in accordance with the value of a control voltage across the capacitor 103 to bring the oscillator output signal into phase synchronism with the data pulses DP. The control voltage constitutes the final form of the control signal CS, as will be described. A limiter 111 is provided for limiting (and squaring) the output signal from the source 101.

The data clock pulse generator of FIG. 1 additionally comprises a voltage-to-current converter 112, a timing circuit 113 and a re-setting circuit 114, which are all involved in the establishment of the appropriate control voltage across the capacitor 103.

Figure 2A:
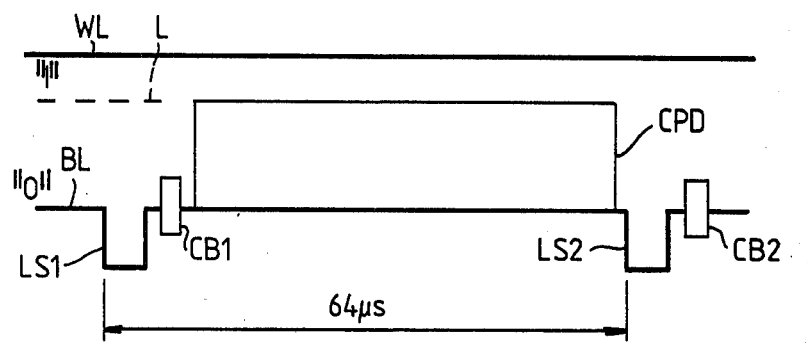
FIGS. 2a, 2b and 2c show certain transmission parameters for a particular form of coded data pulse transmission.

The operation of the re-setting circuit 114 and timing afforded by the timing circuit 113 relate to the coded data pulse transmission in the aforesaid BBC/IBA Teletext television transmission system, and a digression will now be made to explain certain transmission parameters thereof. FIG. 2(a) shows a waveform diagram which represents a Teletext television video signal for one television line which occurs in a field-blanking interval and which includes coded pulse data. In this waveform diagram the line synchronizing pulse for the television line concerned is represented at LS1, and the line synchronizing pulse for the next television line is represented at LS2. The color burst on the television line concerned and that on the next television line, are represented at CB1 and CB2, respectively. Assuming the television broadcast standards for 625-line systems as employed in the United Kingdom, the period of one television line (i.e. the period between the leading edges of successive line synchronizing pulses) is 64 μs, as indicated. Further assuming the standards adopted in the United Kingdom for information transmission by digitally coded pulses in the field-blanking intervals of such a 625-line system (see "Broadcast Teletext Specification", September 1976, published jointly by the British Broadcasting Corporation, Independent Broadcasting Authority and British Radio Equipment Manufacturer's Association), then the television line shown would be line number 17 or 18 in an even field or line number 330 or 331 in an odd field. Such a television line is referred to as a television data line and can contain coded pulse data representing 360 binary bits which may be considered as 45 eight-bit bytes. The position of the coded pulse data in the data line is indicated at CPD. The binary bit signalling rate is approximately 7 Mbit/s, and the binary bit signalling levels are defined between a black level BL and a peak white level WL. The binary '0' level is the level BL and the binary '1' level is the level L.

Figure 2B:
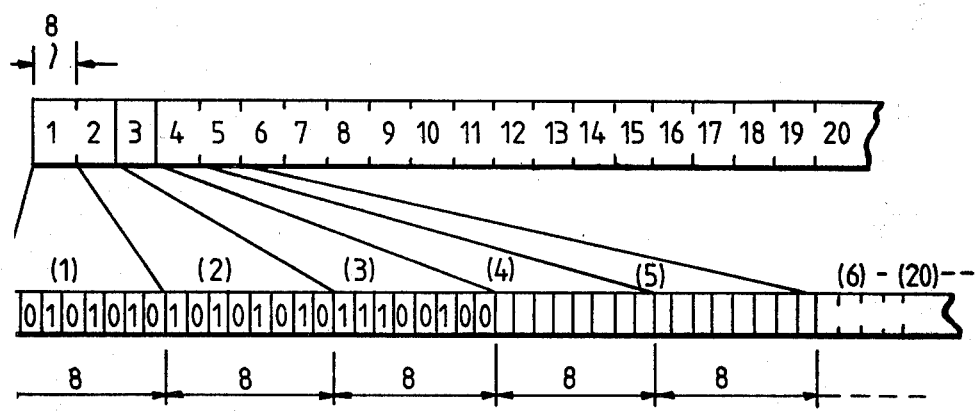

FIG. 2(b) shows a possible format for coded pulse data in a television data line. As mentioned above, the binary bits representing the coded pulse data are divided up into eight-bit bytes 1,2, . . . , 20 . . . . The first two bytes 1 and 2 comprise a sequence of clock run-in pulses which, in the present example, consist of a sequence of alternating bits 10101010/10101010. The third byte 3 comprises a framing or start code, e.g. 11100100, which a data pulse receiver arrangement has to identify before it will respond to accept message information which is contained in the remaining eight-bit bytes 4,5, . . . 20 . . . .

Figure 2C:
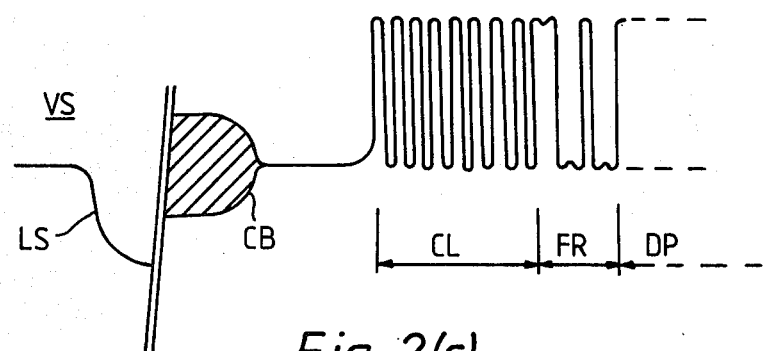

FIG. 2(c) shows, in idealized form, the first part of a video signal waveform VS for a television data line showing the sequence of clock run-in pulses CL and the sequence of pulses which comprise the framing code FR. The first few coded data pulses which represent alpha-numeric characters or other message information are shown at DP. The line synchronizing pulse is represented at LS and the color burst at CB.

Returning to FIG. 1, the re-setting circuit 114 is so organized in relation to the coded data pulse transmission format described above with reference to FIGS. 2a to 2c, that in each television data line, it is operated by the line flyback pulse FL to connect a reference voltage RV across the capacitor 103 during the line blanking interval. This reference voltage RV sets the voltage across the capacitor 103 to a value corresponding to the center or other selected position of its control range; that is, of the phase range afforded by the phase shifter 110. The re-setting circuit 114 can simply comprise, as indicated, a field-effect transistor which is arranged as an electronic switch to connect the reference voltage RV across the capacitor 103 during the application of the flyback pulse FL to its gate electrode.

During the period in each television data line that the sequence of clock run-in pulses CL of the video signal VS occurs, the timing circuit 113 supplies to the voltage-to-current converter 112 a timing pulse T which causes the converter 112 to substantially increase (e.g. double) its current output from a normal rate at which it functions in response to the control signal CS (which it receives as a voltage), so that within this relatively short clock run-in period, the control voltage across the capacitor 103 as produced by the current output of the converter 112 can assume, in respect to the television data line, a starting value corresponding to the mean phase of the sequence of clock run-in pulses CL. For the remainder of the television data line, the converter 112 operates to produce its current output at the normal, lower, rate to provide a more stable control voltage for the code pulses which follow the clock run-in pulses. The initial higher rate of control voltage variation during the clock run-in period enables a reliable starting value for the control voltage to be obtained for satisfactory phase correction in respect to the code pulses. Without this initial action, there may be insufficient time to correct adequately for phase drift between the data pulses and the clock pulses from one television data line to the next.

For producing the timing pulse T, the timing circuit 113 comprises a line synchronizing pulse separator 115 and a pulse generator 116. The synchronizing pulse separator 115 detects the line sync. pulses LS in the video signal VS to trigger the pulse generator 116 which is responsive to produce the timing pulse T. The pulse generator 116 includes a trigger delay such that the timing pulse T occurs at the beginning of the sequence of clock pulses CL and last for substantially the duration thereof.

The data slicer 104, the limiter 111 and the crystal-controlled oscillator 109 can take any suitable known form. As regards the implementation of the phase sensitive detector 102, this can also take any suitable known form, but preferably, it is implemented as set forth in our U.K. patent application No. 8,039,873.

Figure 3:
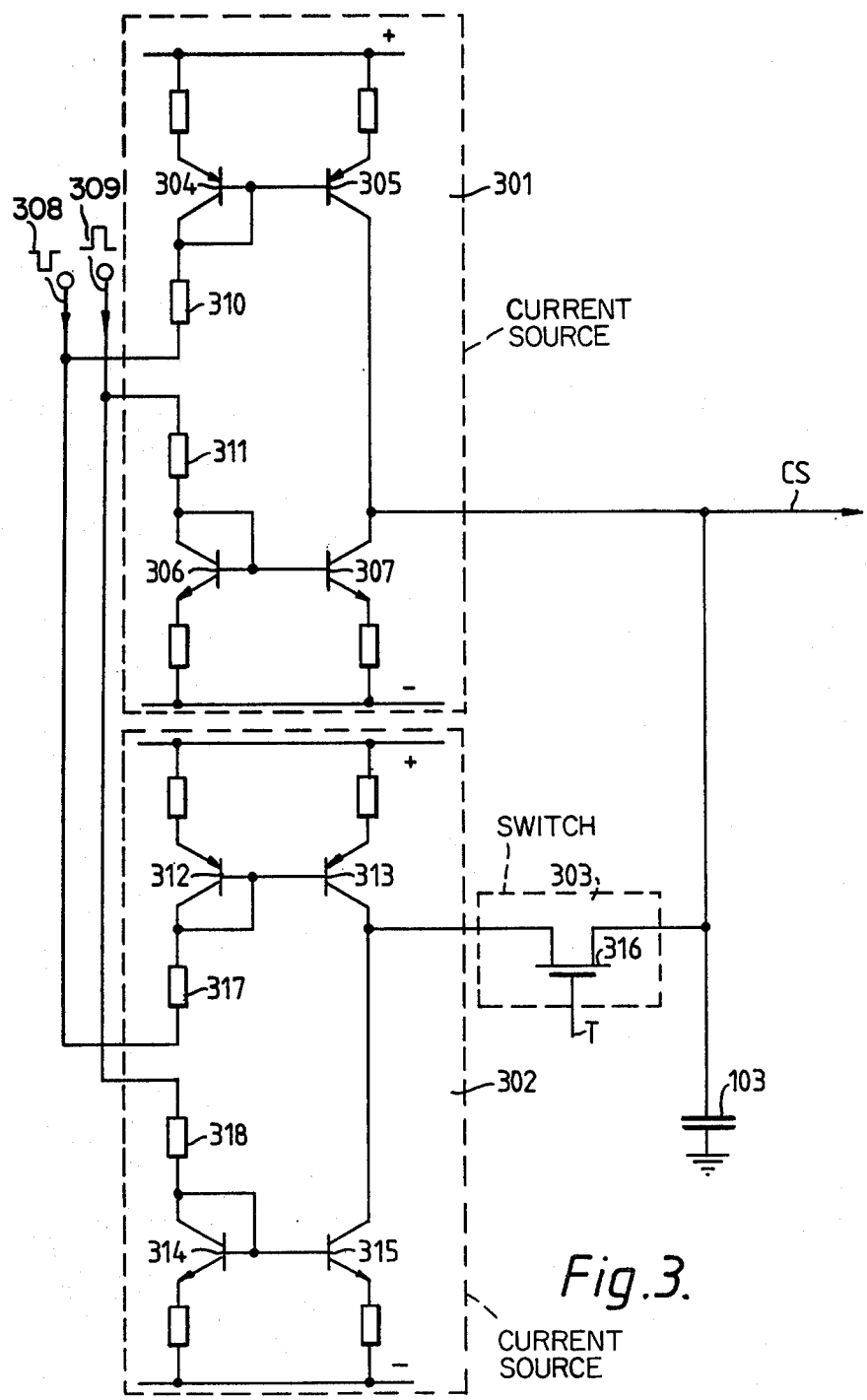
FIG. 3 shows a circuit element for a voltage-to-current converter shown schematically in FIG. 1.

The converter 112 in FIG. 1 preferably takes the form shown in FIG. 3, wherein it comprises two current sources 301 and 302 and an electronic switch 303. The current source 301 comprises two transistor pairs 304/305 and 306/307 of opposite conductivity type, both pairs being connected as current mirrors. The transistors 305 and 307 are connected in push-pull with their collectors connected together and to the capacitor 103, which is the capacitor 103 of FIG. 1. The collectors of the other two transistors 304 and 306 are fed, respectively, with voltage pulses 308 and 309 of opposite polarity, which constitute the voltage output from the phase sensitive detector 102 in FIG. 1. These voltage pulses are assumed to vary in width, in accordance with the difference in phase between the data pulses DP and the clock pulses CK. Two resistors 310 and 311 determine the current magnitude that flows in the transistors 304 and 306 in response to the voltage pulses 308 and 309. The resultant push-pull current in the transistors 305 and 307 adjusts the charge on the capacitor 103. The other current source 302 is provided to supply increased current into the capacitor circuit during the period of the clock run-in pulses CL. This current source 302 is the same as the source 301 in that it comprises two transitor pairs 312/313 and 314/315 of opposite conductivity type which are connected as current mirrors, with the transistors 313 and 315 connected in push-pull with their collectors connected together. However, the output at the collectors of the push-pull transistors 313 and 315 in this current source 302 is connected to the capacitor 103 via the electronic switch 303. This switch 303 comprises a field-effect transistor 316 which has the timing pulse T applied to its gate, so that the capacitor 103 receives current from this current source 302 only for the duration of this timing pulse T. The current due to the current source 302 is made proportionally different to that due to the first current source 301 by suitable selection of the values of resistors 317 and 318 relative to the values of the corresponding resistors 310 and 311 in the current source 301.

Figure 4:
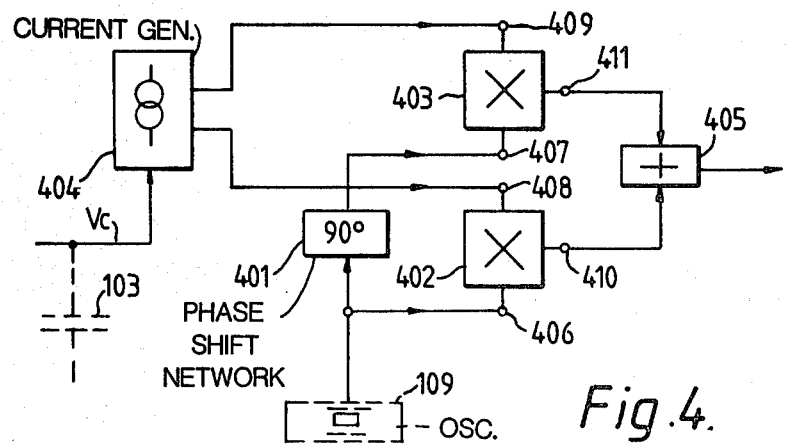
FIG. 4 shows a block diagram of a phase shifter.

The pulse shifter 110 in FIG 1 can take the basic form shown in FIG. 4. This basic form of phase shifter comprises a phase shift network 401, two multipliers 402 and 403, a current generator 404 and an adder 405. The single frequency signal produced by the oscillator 109 is applied directly to one input 406 of the multiplier 402 and via the phase shift network 401 to one input 407 of the multiplier 403. The network 401 provides a 90° phase shift, so that the two signal versions of the oscillator output signal are in phase quadrature. The current generator 404 has the control voltage $V_c$ across the capacitor 103 applied to it and is responsive thereto to produce two control currents which are applied, respectively to respective second inputs 408 and 409 of the two multipliers 402 and 403. At respective outputs 410 and 411, the two multipliers 402 and 403 reproduce the single frequency signal applied to their respective inputs 406 and 407 but with a controlled amplitude which is determined by the value of the respective control currents applied to their other inputs 408 and 409. These two resultant single frequency signals of controlled amplitude and in phase quadrature are applied to the adder 405 which is operable in response thereto to provide a phase shifted version of the original single frequency signal produced by the oscillator 109.

Figure 5:
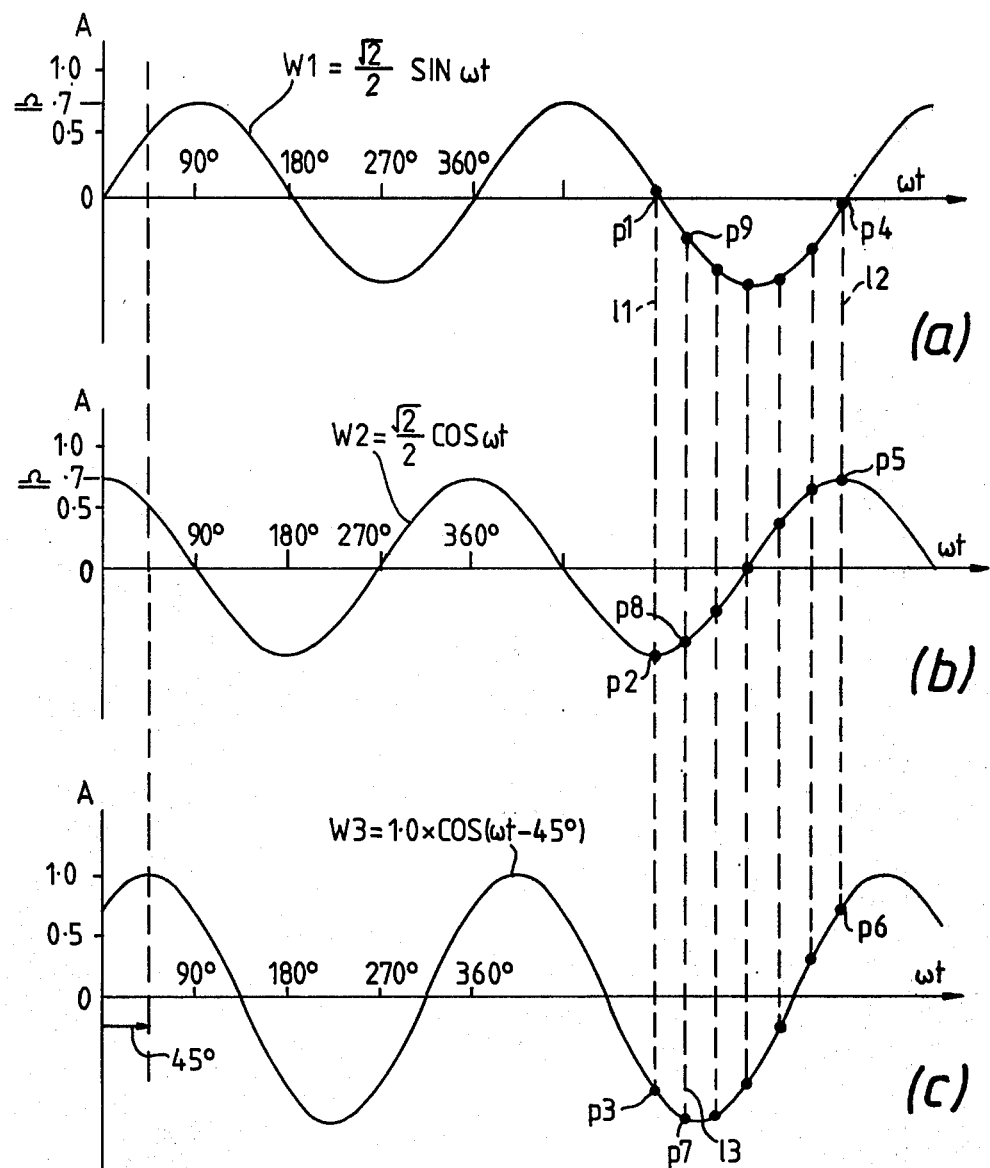
FIGS. 5 and 6 show some explanatory waveform diagrams.
Figure 6:
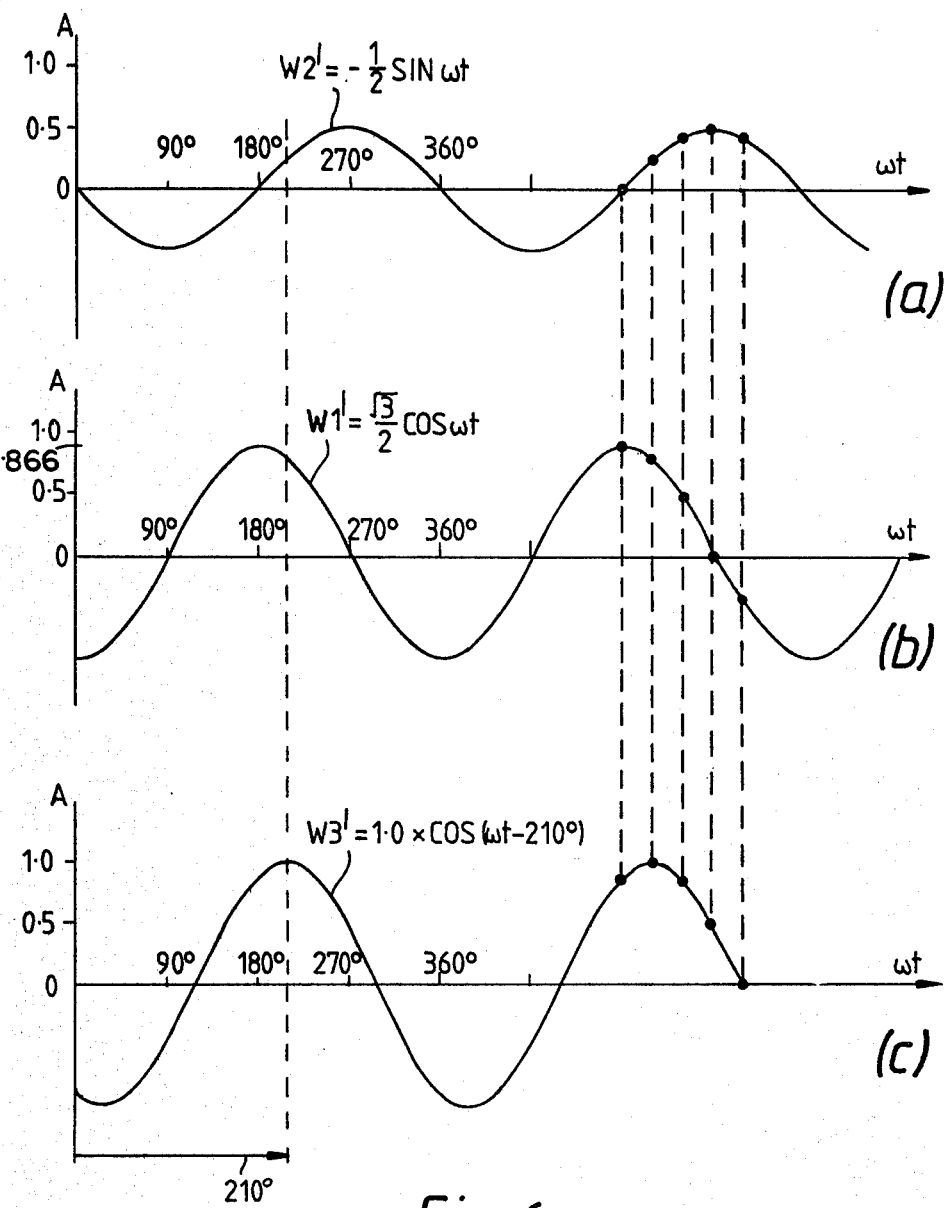

By way of example, the operation of the phase shifter shown in FIG. 4 to produce a phase shift of 45° is illustrated by the waveform diagrams in FIG. 5, and its operation to produce a phase shift of 210° is illustrated by the waveform diagrams in FIG. 6. In FIGS. 5a and 5b, two single frequency waveforms $W1 = \sqrt{2}/2 \cdot \sin wt$ and $W2 = \sqrt{2}/2 \cdot \cos wt$ are shown. These two waveforms W1 and W2 are thus in phase quadrature and each has an amplitude of $\sqrt{2}/2$ current units A. If these two waveforms W1 and W2 are combined, then a resultant waveform $W3 = 1.0 \times \cos(wt - 45°)$ is produced, as shown in FIG. 5c, which has an amplitude of 1.0 current units A, and a phase shift of 45° in that it reaches its peak 45° along the horizontal axis wt. In FIGS. 6a and 6b two further single frequency waveforms $W2' = -\frac{1}{2} \sin wt$ and $W1' = -\sqrt{3}/2 \cos wt$ are shown which are also in phase quadrature, but in this instance the waveform W1' has an amplitude of $\sqrt{3}/2$ current units A and the waveform W2' has an amplitude of $\frac{1}{2}$ current units A. Combining these two waveforms W1' and W2' produces as shown in FIG. 6c, a resultant waveform $W3' = 1.0 \times \cos(wt - 210°)$ which again has an amplitude of 1.0 current units A, but in this instance the waveform W3' reaches its peak 210° along the axis wt and therefore has a phase shift of 210°. The dotted line portions in FIGS. 5 and 6 illustrate the adding of corresponding points on W1, W2 (W1', W2') to form W3 (W3'). For instance, in FIG. 5, the magnitude of waveform W3 at point p3 on line 11 is due to the magnitude at point p2 on waveform W2 because point p1=0 on waveform W1. Similarly on line 12 the magnitude at point p6 is the same as the magnitude at point p5 because point p4=0. On line 13, the magnitude at point p7 on waveform W3 is the sum of the magnitudes at points p8 and p9 on waveforms W2 and W1, respectively. The principle of combining any two waveforms of controlled amplitude in phase quadrature to produce a resultant waveform is further illustrated in FIG. 7 which shows on a circular current vector diagram for the two examples given in FIGS. 5 and 6, the peak current magnitudes of the waveforms W1, W2 and W1', W2' to produce the peak current magnitudes of the two resultant waveforms W3 and W3'. The radius R of the circle represents the unity current A, and any resultant current vector, such as W3 or W3', can be produced from any two vectors x and y in phase quadrature when these two vectors have the relationship $\sqrt{x^2 + y^2} = R = A$.

Figure 8:
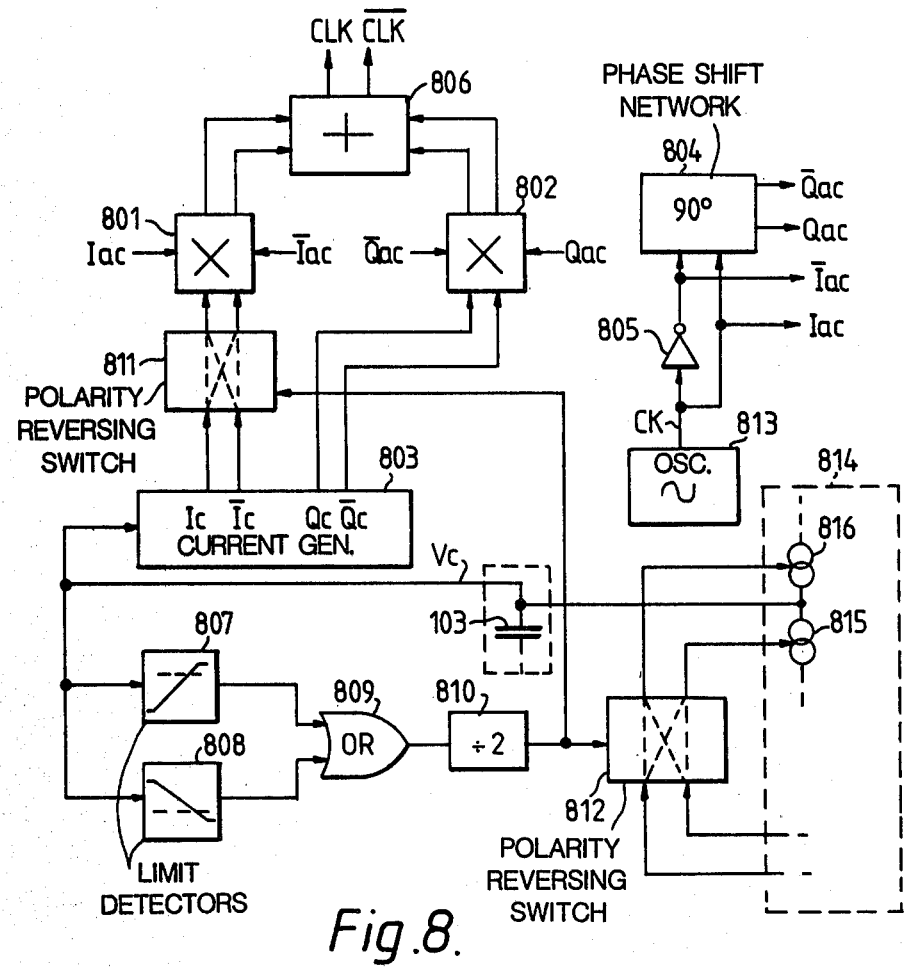
FIG. 8 shows a detailed block diagram of a phase shifter according to the invention.

The phase shifter shown in FIG. 8 functions on the same principle as the basic form of phase shifter shown in FIG. 1, and means are also provided therein for achieving a phase shift of more than 360°. In principle, an unlimited phase shift is possible so that an effective small change (i.e. increase or decrease) in the clock frequency can be produced. The facility of effecting a small clock frequency change can be particularly advantageous where data pulses are clocked into a data pulse receiver arrangement from a video cassette recorder, following receipt and storage of the data pulses from a broadcast Teletext transmission. This advantage is due to the fact that in the "re-transmission" of the data pulses from the video cassette recorder, there can be a significant deterioration in the transmission standards compared with the original broadcast transmission.

The phase shifter shown in FIG. 8 comprises two multipliers 801 and 802, a current generator 803, a 90° phase shift network 804, an inverter 805 and an adder 806. This phase shifter additionally comprises, for achieving (unlimited) phase shifts greater than 360°, two limit detectors 807 and 808, an OR-gate 809, a divide-by-two circuit 810, and two polarity reversing switches 811 and 812. FIG. 8 also shows an oscillator 813, an element 814 of a phase sensitive detector (such as set forth in our said co-pending Application) which produces current for the control voltage $V_c$, and the capacitor 103 across which the control voltage $V_c$ is derived. The output signal CK of the oscillator 813 is applied directly to the phase shift network 804 and also to the inverter 805 whose output signal is also applied to phase shift network 804. The oscillator output signal and the inverter output signal form one pair of anti-phase single frequency signals $I_{ac}$, $\bar{I}_{ac}$ and the two output signals from the phase shift network 804 form another pair of anti-phase single frequency signals $Q_{ac}$, $\overline{Q}_{ac}$ which are respectively, in phase quadrature with the signals $I_{ac}$, $\overline{I}_{ac}$. The multipliers 801 and 802 are respective four-quadrant multipliers (e.g. Mullard type TCA 240), and the signals $I_{ac}$, $\overline{I}_{ac}$ are applied to one pair of inputs of the multiplier 801 and the signals $Q_{ac}$, $\overline{Q}_{ac}$ are applied to one pair of inputs of the multiplier 802. Two oppositely poled currents $I_c$, $\overline{I}_c$ are applied to the other pair of inputs of the multiplier 801 and two oppositely poled currents $Q_c$, $\overline{Q}_c$ are applied to the other pair of inputs of the multiplier 802. These two pairs of currents $I_c$, $\overline{I}_c$ and $Q_c$, $\overline{Q}_c$ are produced by the current generator 803 in response to the applied control voltage $V_c$. Within the multipliers 801 and 802, the signal pairs and current pairs are multiplied together to produce pairs of resultant output signals which are combined separately by the adder 806 to form two anti-phased and phase-shifted versions CLK and $\overline{CLK}$ of the original single frequency signal CK.

Considering FIG. 7 again, in conjunction with the operation of the multipliers 801 and 802, when the difference between the pair of currents $I_c$, $\overline{I}_c$ is positive, then in the multiplier 801 this positive difference current is modulated by $I_{ac}$ to produce the current vector W1 which (for a 45° phase shift, has an amplitude of $\sqrt{2}/2$ (i.e $1/\sqrt{2}$). Similarly, when the difference between the pair of currents $Q_c$, $\overline{Q}_c$ is positive, then in the multiplier 802 this positive difference current is modulated by $Q_{ac}$ to produce the current vector W2 which (for a 45° phase shift) has an amplitude of $\sqrt{2}/2$ (i.e. $1/\sqrt{2}$). Combining W1 and W2 in adder 806 produces W3, (i.e. CLK). Since the signals $\overline{I}_{ac}$ and $\overline{Q}_{ac}$ are also available in the multipliers 801 and 802, the positive difference currents are also modulated by $\overline{I}_{ac}$ and $\overline{Q}_{ac}$ to produce anti-phase versions of W1 and W2 which are combined in adder 806 to produce an anti-phase version of W3, (i.e. $\overline{CLK}$). For the second example shown in FIG. 7, the difference between each of the current pairs $I_c$, $\overline{I}_c$ and $Q_c$, $\overline{Q}_c$ is negative, so that modulation by $I_{ac}$ and $Q_{ac}$, respectively, produces the vectors W1' and W2' which when combined produce W3'. (i.e. CLK with a 120° phase shift). $\overline{CLK}$ is also produced by combining the anti-phase versions of W1' and W2'.

For (unlimited) phase shifts greater than 360°, the elements 807 to 812 become operative as follows. The control voltage $V_c$ has a predetermined operating range about a mean value, for example, a range of $+2\frac{1}{2}$ volts to $+3\frac{1}{2}$ volts about a mean value of 3 volts. Within this range it can be arranged such that when the control voltage $V_c$ is 3 volts, there is zero phase shift; and the phase shift varies progressively from 0° to $+180°$ as the control voltage $V_c$ increases to $3\frac{1}{2}$ volts and it varies progressively from 0° to $-180°$ as the control voltage $V_c$ decreases to $2\frac{1}{2}$ volts.

When either limit of the operating range is reached by the control voltage $V_c$, the relevant limit detector 807 or 808 produces an output signal which is applied via the OR-gate 809 and the divide-by-two circuit 810 to operate the polarity reversing switches 811 and 812. The effect of operating the switch 811 is to reverse the sense of the difference current between the pair of current $I_c$, $\overline{I}_c$, but this reversal has no effect on the output signals of the multiplier 801, other than to reverse their phases, the net output thus remaining the same, because the limits of the limit detectors 807 and 808 are chosen such that $I_c - \overline{I}_c = 0$ when switching occurs. The effect of operating the switch 812 is to reverse the sense of the output of the phase sensitive detector (102—FIG. 1), that is, the sense of the variation of the control voltage $V_c$ in response to phase variation is reversed. Where the phase sensitive detector takes the form described in our said co-pending Application, this output reversal can be achieved by switching the control inputs to the two current generators 815 and 816 which feed charging and discharging current to the capacitor 103.

Figure 10:
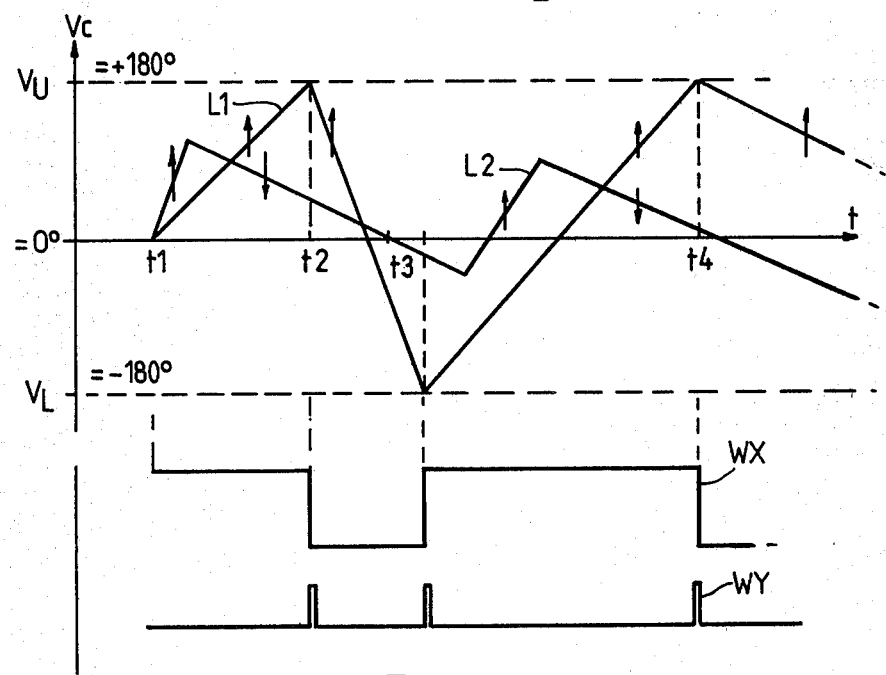
FIG. 10 shows a graph illustrating one aspect of the operation of the phase shifter of FIG. 8.

The effect of this operation of the elements 807 to 812 is illustrated in the graph shown in FIG. 10. In this graph, the vertical axis $V_c$ represents the control voltage $V_c$ and the horizontal axis represents time t. The line L1 shows that over the period $t_1$ to $t_2$ the phase is increasing (say) with increase in control voltage $V_c$. At time $t_2$ the upper limit $V_U (=3\frac{1}{2}$ volts, say) of the control voltage $V_c$ is reached and polarity switching is then effected, as aforesaid. Assuming that the phase continues to increase over the period $t_2$ to $t_3$, then this is signified by the control voltage $V_c$ progressively reducing to the lower limit $V_L (=2\frac{1}{2}$ volts, say). The detection of this lower limit $V_L$ brings about polarity switching again, so that if the phase still continues to increase beyond $t_3$ then this is signified by the control voltage $V_c$ progressively increasing again towards upper limit $V_U$ at time $t_4$, and so on. In each time period, such as $t_2 - t_3$, between the detection of the upper and lower limits $V_U$ and $V_L$, a phase shift of 360° is effected. The upwardly pointing arrows across line L1 signify the continuous phase increase. The pulse waveform WX represents the output from the divide-by-two circuit 810, and the pulse waveform WY represents the output from the exclusive OR-gate 809.

The line L2 illustrates that for a phase shift of less than $\pm 180°$, the phase simply increases and decreases as the control voltage $V_c$ increases and decreases. In this instance the arrows across line L2 are alternately pointing upwards and downwards to signify the change in phase direction.

The upper and lower limits $V_U$ and $V_L$ of the control voltage $V_c$ can be in respect to smaller phase ranges than $\pm 180°$; for instance, a phase range of $\pm 90°$ or $\pm 45°$ can be used. Also, larger phase ranges such as $\pm 360°$ are possible.

Figure 11:
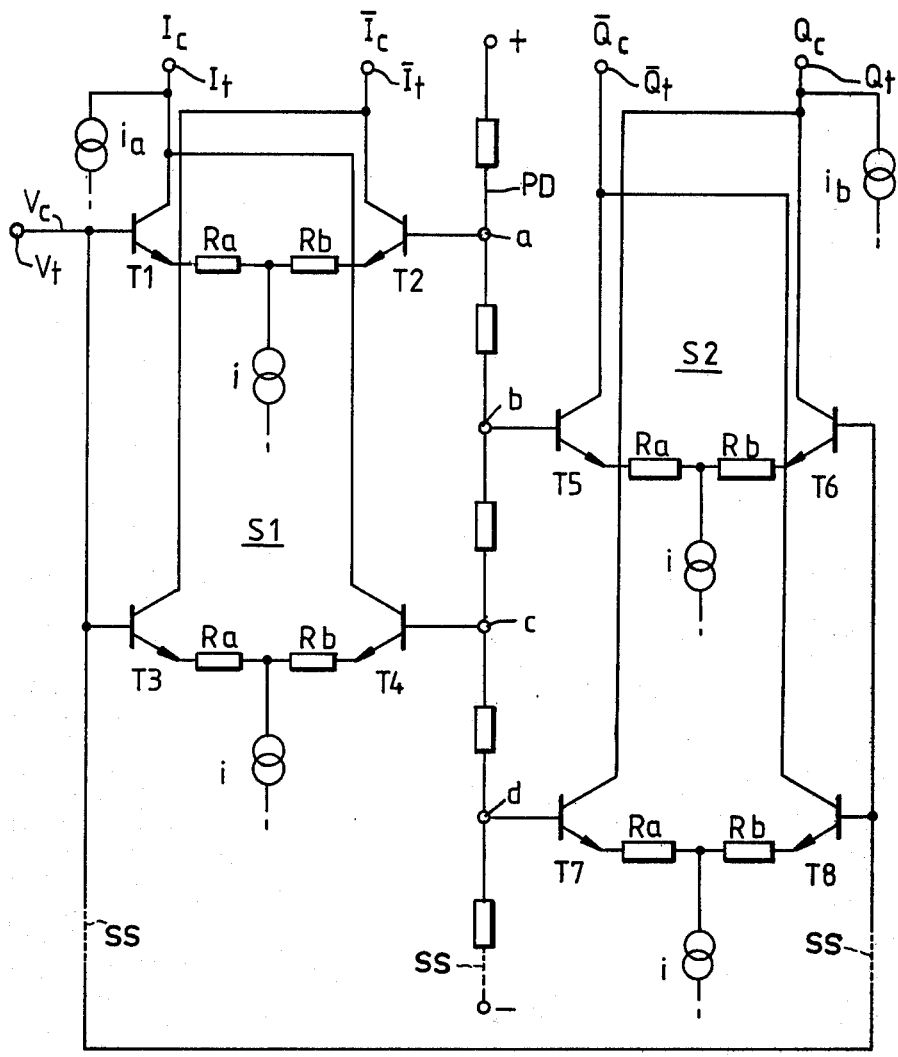
FIG. 11 shows a simplified circuit diagram of a current generator for the phase shifters of FIGS. 4 and 8.

FIG. 11 shows a simplified circuit diagram of a current generator (404—FIG. 4) and (803—FIG. 8) employed in the phase shifter. This current generator comprises a plurality of pairs of transistors T1/T2, T3/T4, T5/T6 and T7/T8 connected in a long-tailed configuration. These transistor pairs are arranged in two sets S1 and S2 which provide the two pairs of oppositely poled currents $I_c$, $\overline{I}_c$ and $Q_c$, $\overline{Q}_c$, respectively. Each of the transistors pairs has an individual (constant) current source i to which the emitters of the two transistors are connected via respective emitter resistances Ra and Rb. All the emitter resistances Ra and Rb are of the same value and all the current sources i are substantially the same as each other. Each of the two sets S1 and S2 also has a respective balance current source $i_a$ and $i_b$ which are also the same as the other current sources i. In practice, all the current sources would be comprised by respective transistor circuits. There is also provided a potential divider PD having four tapping points a, b, c and d to which one transistor (I.e. T2, T4, T5 and T7) in each of the transistor pairs has its base connected, respectively. The other transistor (i.e. T1, T3, T6 and T7) in each of the transistor pairs has its base connected to an input terminal Vt to which the control voltage $V_c$ is applied.

The operation of the current generator can best be explained by considering firstly the conductive states of the transistor pairs, for different values of control voltage $V_c$, with the assumption that the emitter resistances Ra and Rb are of zero value, so that one transistor of each pair is fully conductive and the other transistor of the pair is non-conductive. It is further assumed that each of the current sources i (and $i_a$ and $i_b$) provides one unit of current. The conductive states of the transistor pairs and the resultant output current $I_c$ and $\bar{I}_c$ and $Q_c$ and $\bar{Q}_c$ at respective positive and negative output terminals It, $\bar{\text{I}}$t and Qt, $\bar{\text{Q}}$t to which the collectors of the successive transistors pairs of the two sets S1 and S2 are connected alternately, depends on the value of the control voltage Vc relative to the potentials at the potential divider tapping points a, b, c and d, as set forth in the following Table:

TABLE

| Value of $V_c$ | $I_c$ | $\bar{I}_c$ | $I = I_c - \bar{I}_c$ | $\bar{Q}_c$ | $Q_c$ | $Q = Q_c - \bar{Q}_c$ |
|---|---|---|---|---|---|---|
| $V_c > a$ | $i_a + \text{T1}$ = 2 | T3 = 1 | +1 | T8 = 1 | $i_b + \text{T6}$ = 2 | +1 |
| $a > V_c > b$ | $i_a$ = 1 | T2 + T3 = 2 | −1 | T8 = 1 | $i_b + \text{T6}$ = 2 | +1 |
| $b > V_c > c$ | $i_a$ = 1 | T2 + T3 = 2 | −1 | T5 + T8 = 2 | $i_b$ = 1 | −1 |
| $c > V_c > d$ | $i_a + \text{T4}$ = 2 | T2 = 1 | +1 | T5 + T8 = 2 | $i_b$ = 1 | −1 |
| $V_c < d$ | $i_a + \text{T4}$ = 2 | T2 = 1 | +1 | T5 = 1 | T7 + $i_b$ = 2 | +1 |

Figure 7:
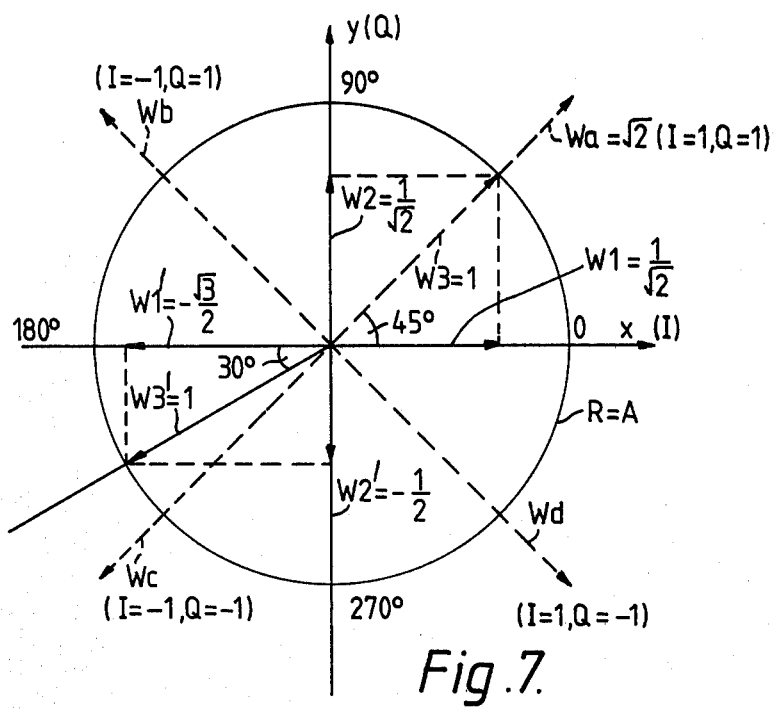
FIG. 7 shows an explanatory circular diagram.

Considering the above Table in relation to FIG. 7, when $V_c > a$, the current $I_c$ is made up of the balance current $i_a$ plus the current through transistor T1, and the current $\bar{I}_c$ is made up solely of the current through transistor T3. Similarly, the current $\bar{Q}_c$ is made up of the balance current $i_b$ plus the current through transistor T6, and the current $Q_c$ is made up solely of the current through transistor T8. If these two current pair magnitudes were applied to the two multipliers 801 and 802 in FIG. 8, then since in each pair the difference current is +1 (i.e. I=2−1 and Q=2−1), they would generate a current vector Wa, as shown in dotted line in FIG. 7 having an angle of 45° and a magnitude of $\sqrt{2}$. When $V_c$ lies between a and b, I=−1 and Q=+1, so that the current vector Wb of magnitude $\sqrt{2}$ would be generated. Similarly, current vectors Wc and Wd each of magnitude $\sqrt{2}$ would be generated when $V_c$ lies between b and c and between c and d, respectively.

Figure 12:
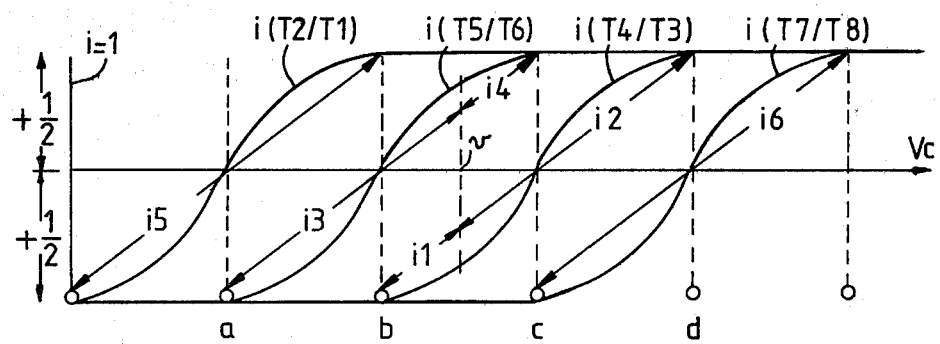
FIG. 12 shows a graph illustrating the operation of the current generator of FIG. 11.

However, the presence of the emitter resistances Ra and Rb ensure that the current pairs $I_c$ and $\bar{I}_c$ and $Q_c$, $\bar{Q}_c$ are actually produced with magnitudes that produce resultant current vectors such as W3 and W3' which lie approximately on the radius R and which can be at any angle around this radius. The effect of the emitter resistances Ra and Rb is to proportion the current through the two transistor pairs one in each of the sets S1 and S2, which have the bases of their relevant transistor connected to the particular two adjacent potential divider tapping points between the potentials of which the control voltage $V_c$ lies. Thus, if the control voltage $V_c$ lies between b and c, then the transistor pairs T1/T2 and T7/T8 have one transistor conductive and the other non-conductive as before, but the transistor pairs T3/T4 and T5/T6 have their two transistors partially conductive differentially. FIG. 12 illustrates the respective current proportions through the transistor pairs. The arrowed line $V_c$ represents decreasing values of the control voltage $V_c$ relative to the potentials at the tapping points a, b, c and d of the potential divider PD. The lines i(T2/T1), i(T4/T3), i(T5/T6) and i(T7/T8) represent the proportions of the currents through the respective transistor pairs. From the example being considered, it can be seen that for an actual control voltage value v lying between b and c, the current through the two transistors T3 and T4 is in the proportion i2 to i1 and the current through the two transistors T5 and T6 is in the proportion i3 to i4. In the transistor pair T1/T2, transistor T2 has the entire current position i5 and in the transistor pair T7/T8 transistor T8 has the entire current proportion i6. Thus the total current $I_c$, $\bar{I}_c$ and $Q_c$, $\bar{Q}_c$ are produced in the appropriate proportions.

The four long-tailed transistor pairs in the current generator of FIG. 11 provide a phase shift range between 0° and 360°. This phase range can be increased by increasing the number of long-tailed transistor pairs in each of the sets S1 and S2 as signified by the broken lines SS. In general, it can be seen that a long-tailed transistor pair is required for each 90 degrees of phase shift. However, practical considerations would govern the actual number of transistor pairs which could be provided to achieve a number of complete cycles of phase shift for a given range of the control voltage $V_c$. Above this actual number, further complete cycles of phase shift can be achieved by polarity switching of the control voltage $V_c$ as already described with reference to FIG. 9.

Preferably, the current sources i (and $i_a$ and $i_b$) are constant current sources to provide optimum linearity of operation.

Figure 9:
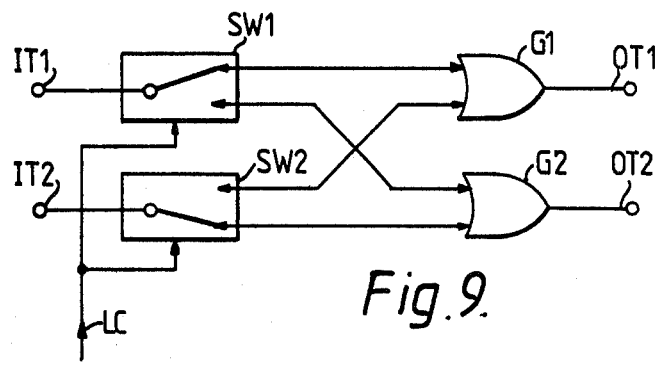
FIG. 9 shows a circuit element for a polarity reversing switch shown schematically in FIG. 8.

Each of the reversing switches 811 and 812 in the phase shifter of FIG. 8 can take the form shown in FIG. 9, wherein the switch comprises two change-over switch elements SW1 and SW2 and two OR-gates G1 and G2. When the switch elements SW1 and SW2 are unoperated, element SW1 interconnects an input terminal IT1 with an output terminal OT1 via OR-gate G1, and element SW2 interconnects an input terminal IT2 with an output terminal OT2 via OR-gate G2. When the switch elements SW1 and SW2 are operated by a switching signal (e.g. the control voltage $V_c$) applied to a lead LC, the above interconnections are reversed.

We claim:

1. A phase shifter for phase shifting a single frequency signal comprising: phase quadrature means for producing in phase quadrature first and second signal versions of the single frequency signal, function generator means responsive to a control signal representative of a required phase shift to produce first and second control factors, multiplier means operable to multiply said first and second signal versions by said first and second control factors, respectively, to produce resultant first and second signal versions in phase quadrature having respective controlled amplitudes, and combining means for combining said first and second resultant signal versions to produce an output signal which is a phase shifted version of said (original) single frequency signal, the controlled amplitudes of said resultant signal versions determining the phase of the output signal, and the phase shift ($\theta$) of the output signal relative to the original signal being arranged to lie anywhere between 0° and 360° by arranging the function generator means so that the controlled amplitudes of said resultant signal versions are made positive or negative, selectively, so that the phase shift lies in one of the four quadrants 0° to 90°, 91° to 180°, 181° to 270°, 271° to 360°, characterized in that said phase shifter further comprises capacitor means for integrating said control signal and additional means associated with said function generator means and responsive to a first range of values of the integrated control signal to cause the production by the function generator means of said first and second control factors in respect of a first phase shift between 0° and 360°, said additional means being thereafter responsive to at least one further range of values of the integrated control signal to cause the production by the function generator means of said first and second control factors in respect of one or more further phase shifts between 0° and 360°, whereby the phase shift ($\theta$) can extend over a number of complete cycles of the single frequency signal.

2. A phase shifter as claimed in claim 1, characterized in that said additional means comprises first means which, each time the integrated control signal reaches one of two spaced limit values, is operable to reverse the operating sense of the phase shifter in its utilization of said first and second control factors, together with second means for causing an associated phase sensitive detector, which produces the control signal, to reverse the sense that the control signal changes value in response to detected phase variation, the successive excursions of the integrated control signal between said two limit values forming said first and further ranges of values thereof.

3. A phase shifter as claimed claim 2, characterized in that said given phase range is the range ±180°.

4. A phase shifter as claimed in claim 2 or claim 3, characterized in that said first and second means comprise respective polarity reversing switches which are connected for operation by the output signal of an arrangement comprising a first limit detector which is connected to receive the integrated control signal and produces a first limit signal each time the control signal reaches one limit value a second limit detector which is also connected to receive the integrated control signal and produces a second limit signal each time the integrated control signal reaches its other limit value, and a divide-by-two circuit which is connected to receive said first and second limit signals and is responsive to produce a change in said output signal from one of two levels to the other in response to each limit signal, the polarity reversing switches being operated from their subsisting condition to the opposite condition in response to each output signal change.

5. A phase shifter as claimed in claim 1, wherein the first and second signal versions as produced by the phase quadrature means comprise respective pairs of anti-phase signals, wherein the first and second control factors are control currents which are produced by a current generator, which constitutes the function generator means, as respective pairs of oppositely poled currents of which the difference between the two currents of each pair represents the relevant control current, and wherein said multiplier means comprises a first four quadrant multiplier for producing said first resultant signal version in response to one of said pairs of anti-phase signals and one of said pairs of oppositely poled currents, and a second four quadrant multiplier for producing said second resultant signal version in response to the other of said pairs of anti-phase signals and the other of said pairs of oppositely poled currents.

6. A phase shifter as claimed in claim 5, wherein said current generator comprises a plurality of transistor pairs each having first and second transistors connected in a long-tailed configuration in which their emitters are coupled to a current source via respective emitter resistances, which transistor pairs are arranged in two sets that provide said respective pairs of oppositely poled currents at respective pairs of positive and negative output terminals; in which two sets, the base of the first transistor of each pair is connected to receive a control voltage which constitutes said integrated control signal and the base of the second transistor of each pair is connected to a respective tapping point of a potential divider, which tapping points, as considered in their order of potential, have the bases of the second transistors from one set and the other connected to them alternately; and in each set the collectors of the first transistors of successive transistor pairs are connected to the positive output terminal and the negative output terminal alternately, and likewise their second transistor collectors are connected to these terminals alternately, the arrangement being such that for a given value of control voltage lying between the potentials of two immediately adjacent tapping points, those transistor pairs having their second transistor bases connected to respective other tapping points have one transistor fully conductive and the other non-conductive, whereas for the two transistor pairs, one from each set, having their second transistor bases connected, respectively, to these two immediately adjacent tapping points, their two transistors are both partially conductive differently to an extent determined by the value of said emitter resistance and said control voltage.

7. A phase shifter as claimed in claim 1, 4 or 5, embodied in a data clock pulse generator in which the locally generated clock pulses are generated by an oscillator and are applied to the phase shifter which is controlled by said control signal to produce phase-corrected clock pulses.

8. A phase shifter as claimed in claim 6, wherein a transistor pair is provided for each 90° of phase shift.

9. A phase shifter as claimed in claim 7 or 8 wherein said current sources are constant current sources.

* * * * *

UNITED STATES PATENT AND TRADEMARK OFFICE
CERTIFICATE OF CORRECTION

PATENT NO. : 4,431,969

DATED : February 14, 1984

INVENTOR(S) : CHRISTOPHER P. SUMMERS ET AL

It is certified that error appears in the above—identified patent and that said Letters Patent is hereby corrected as shown below:

Claim 6, line 46, change "differently" to --differentially--;

Claim 7, line 1, change "4" to --2--.

Signed and Sealed this

Twenty-fourth Day of April 1984

[SEAL]

Attest:

GERALD J. MOSSINGHOFF

Attesting Officer

Commissioner of Patents and Trademarks